United States Patent
Park

(10) Patent No.: US 7,651,884 B2
(45) Date of Patent: Jan. 26, 2010

(54) METHOD OF FABRICATING A CMOS IMAGE SENSOR WITH MICRO LENSES FORMED IN A WIRING LAYER

(75) Inventor: Jeong-Su Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 168 days.

(21) Appl. No.: 11/840,065

(22) Filed: Aug. 16, 2007

(65) Prior Publication Data

US 2008/0044941 A1 Feb. 21, 2008

(30) Foreign Application Priority Data

Aug. 18, 2006 (KR) .................. 10-2006-0077957

(51) Int. Cl.
*H01L 31/18* (2006.01)
(52) U.S. Cl. .................. 438/71; 438/98; 257/E31.13
(58) Field of Classification Search .............. 438/71
See application file for complete search history.

(56) References Cited

U.S. PATENT DOCUMENTS 5,316,640 A 5/1994 Wakabayashi et al.
2006/0141660 A1* 6/2006 Lee ........................ 438/70

FOREIGN PATENT DOCUMENTS

| CN | 1815746 | 8/2006 |
| JP | 11-119004 | 4/1999 |
| KR | 1020020045162 A | 6/2002 |
| KR | 1020040071066 A | 8/2004 |

* cited by examiner

*Primary Examiner*—Stephen W Smoot
(74) *Attorney, Agent, or Firm*—Sherr & Vaughn, PLLC

(57) ABSTRACT

A fabrication method of a CMOS image sensor provides forms micro lenses over a substrate by etching a plurality of holes in a wiring layer over a pixel area. An oxide layer is deposited to form a surface with a semi-circular cross section over the holes. The oxide layer may be etched away, leaving micro lenses formed in the wiring layer.

9 Claims, 5 Drawing Sheets

METHOD OF FABRICATING A CMOS IMAGE SENSOR WITH MICRO LENSES FORMED IN A WIRING LAYER

The present application claims priority under 35 U.S.C. 119 to Korean Patent Application No. 10-2006-0077957 (filed on Aug. 18, 2006), which is hereby incorporated by reference in its entirety.

BACKGROUND

Briefly describing the operation of an image sensor, light energy reflected from an object is absorbed by an optoelectronic converter and electrons are freed by the photoelectric effect. The quantity of freed electrons is proportional to the amount of light absorbed. The freed electrons are accumulated in the optoelectronic converter formed over a semiconductor substrate. The electrons form a signal which is read out of the converter. A photo diode may be used as an optoelectronic converter.

An image sensor may include micro lens arrays that collect light and focus it on the photo diode. The micro lens array may be formed by selectively patterning a wiring layer inside the image sensor and by annealing in a reflow process. The annealing in the reflow process may not form the critical dimension of the micro lens uniformly or properly control the thickness and the radius of curvature of the micro lens. Since the selective patterning process is performed after a metal pad is exposed, the surface of the metal pad may be damaged by a strong alkaline developer used in the patterning process.

SUMMARY

Embodiments relate to a fabrication method of a CMOS image sensor including a micro lens without relying on reflow by annealing. A CMOS image sensor fabrication method according to embodiments may include forming a photo diode over a semiconductor substrate. A wiring layer may be formed over the substrate. A plurality of holes may be formed in the wiring layer using a first etching process. A first oxide film may be stacked over the wiring layer. Micro lenses may be formed by performing a second etching process on the first oxide film.

A fabricating method of a CMOS image sensor according to embodiments may include forming a photo diode and wiring layer over a semiconductor substrate. A protective oxide film may be formed over the wiring layer in areas which are not directly over the photo diode. Then holes may be formed in the wiring layer using a first etching process. A first oxide film may then be stacked over the wiring layer and the protective oxide film. A plurality of micro lenses may then be formed using a second etching process.

DRAWINGS

Example FIGS. 1a to 1e are views showing a fabrication method of a CMOS image sensor according to embodiments.

Example FIGS. 2a to 2e are views showing a fabrication method of a CMOS image sensor according to embodiments.

DESCRIPTION

Figure 1A:
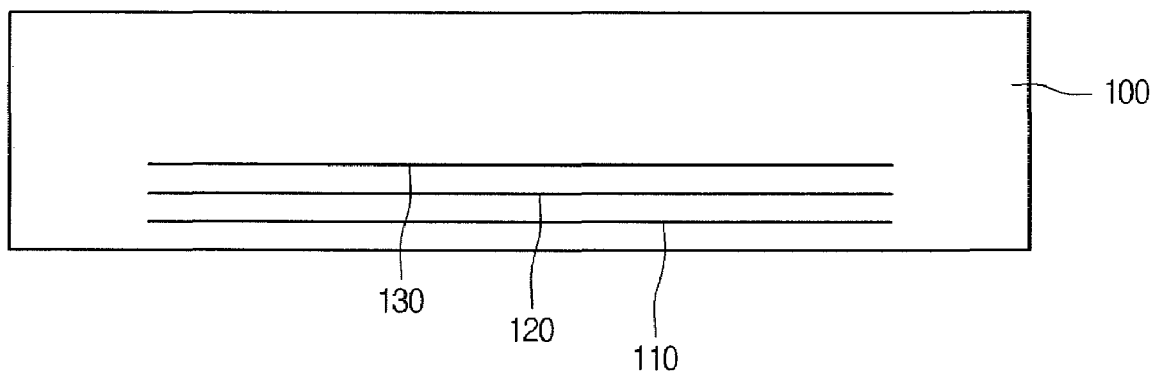

Referring to Example FIG. 1a, pixel areas each including a plurality of photo diodes are formed over a semiconductor substrate 100. The photo diode can include a red detection diode 110 generating photo-charge by reacting to red light, a green detection diode 120 generating the photo-charge by reacting to green light, and a blue detection diode 130 generating the photo-charge by reacting to blue light.

Figure 1B:
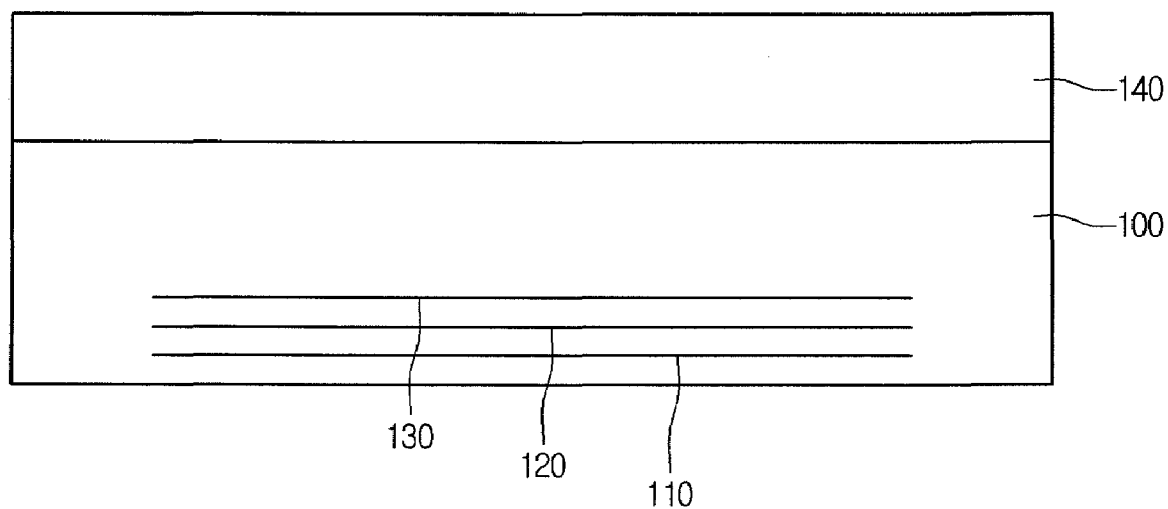

Referring to example FIG. 1b, a wiring layer 140 may include a via or a contact connecting a device such as a transistor including a gate for a subsequent signal processing. Insulating material may be formed over the substrate 100. The wiring layer 140 may include transparent material to allow light to reach a lower photo diode through the wiring layer 140.

Figure 1C:
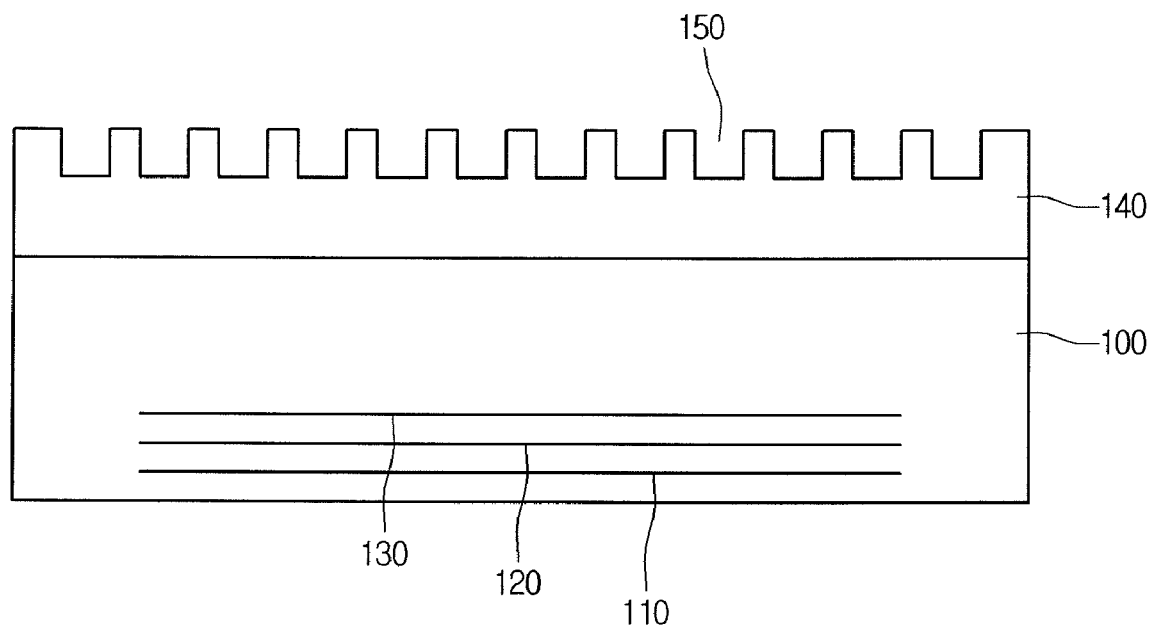

Referring to example FIG. 1c, a plurality of holes 150 having a predetermined depth and spaced from each other are shown. Holes 150 may be formed by stacking, patterning and etching a photo mask over the wiring layer 140.

Figure 1D:
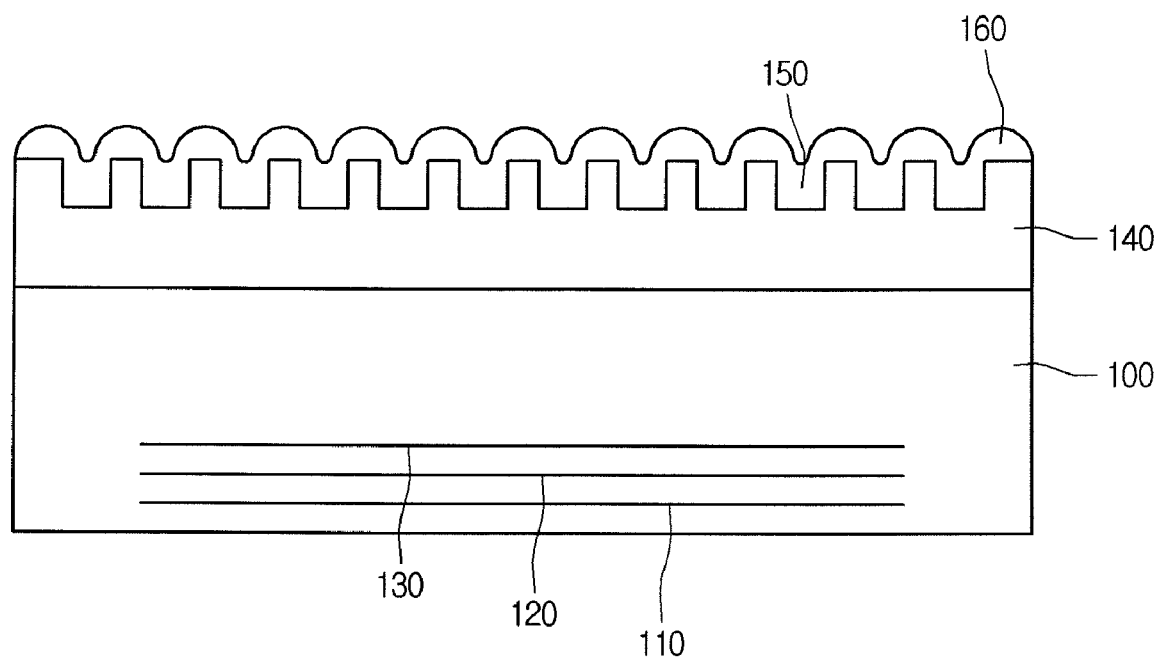

Referring to example FIG. 1d, a first oxide film 160 is stacked over the wiring layer 140. At this point, the first oxide film 160 has a topology determined by the topology of the hole 150. Since the side of each hole is inferior for stacking, as compared to the bottom, the cross section of the first oxide film 160 has a curved surface, unlike the cross section of the hole 150. The first oxide film 160 may be deposited by, for example, a high density plasma chemical vapor deposition (HDPCVD) method. Undoped silica glass can be used as the first oxide film 160.

Figure 1E:
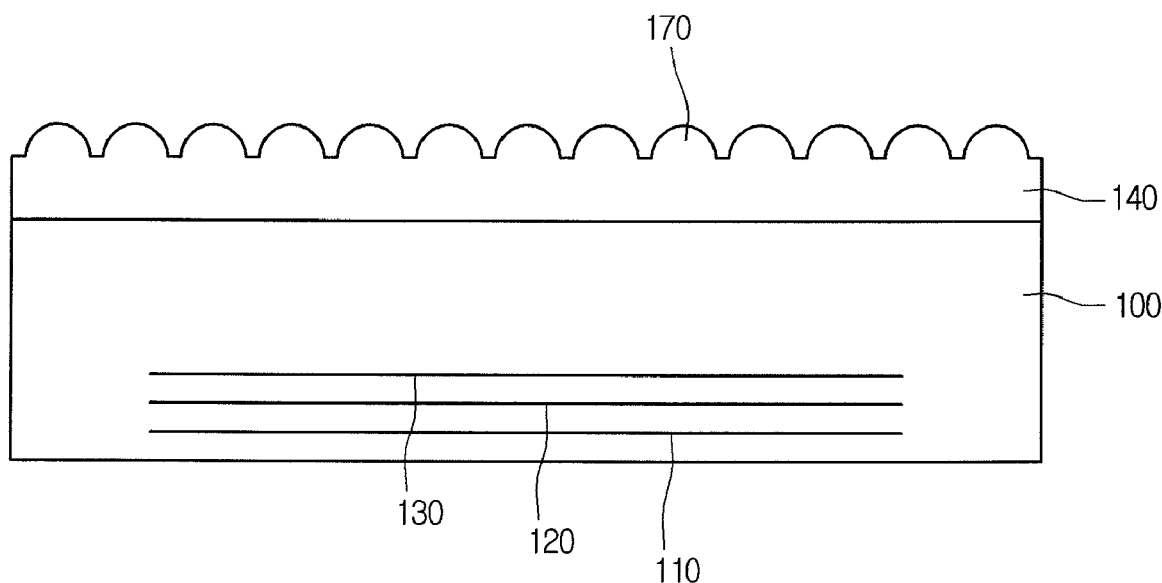

Referring to example FIG. 1e, the first oxide film 160 stacked over the hole 150 may be removed by an etching process. The etching process may be a dry etching process. An anisotropic etching process may be used to remove the first oxide film 160 at a predetermined depth. This will preserve the original semi-circular cross sectional shape of the surface of the oxide film 160. The wiring layer 140 retains a semi-circular structure 170, after the oxide film 160 is etched. The structures 170 with a predetermined topology form micro lenses for focusing light onto the photo diodes 110, 220, and 230.

According to embodiments, a protective oxide film and a micro lens may also be formed simultaneously. Referring to example FIG. 2a, pixel areas each including a plurality of photo diodes are formed over a semiconductor substrate, as described above. The photo diode is constituted by a red detection diode 210 generating photo-charge by reacting to red light, a green detection diode 220 generating the photo-charge by reacting to green light, and a blue detection diode 230 generating the photo-charge by reacting to blue light.

A wiring layer 240 may include a via or a contact connecting a device such as a transistor including a gate for a subsequent signal processing. Insulating material may be formed over the substrate 200. The wiring layer 240 may include transparent material to allow light to reach a lower photo diode through the wiring layer 240.

Figure 2A:
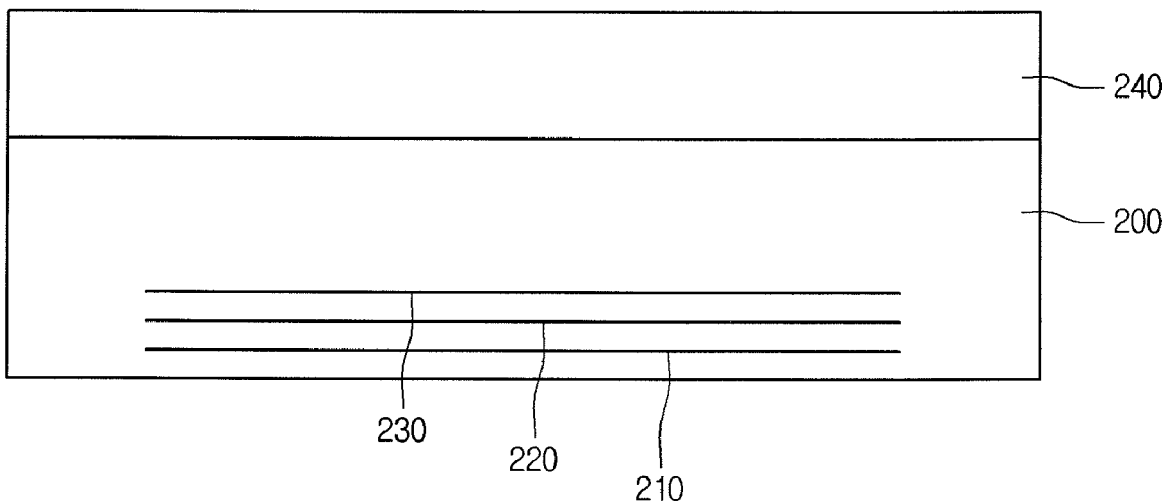
Figure 2B:
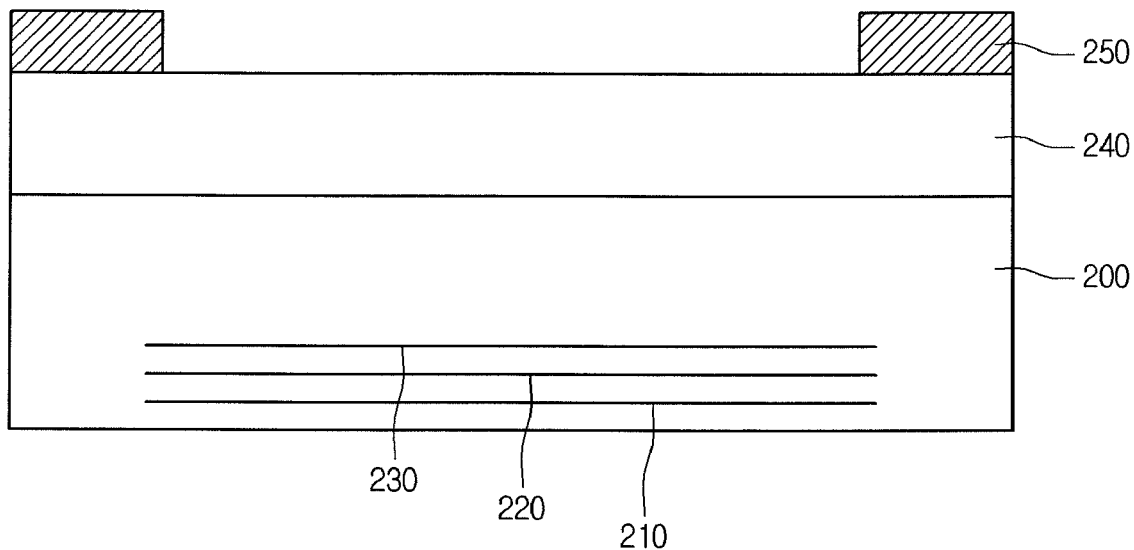

Referring to example FIG. 2b, a protective oxide film 250 may be formed over the wiring layer outside of the area where the photo diode is formed, as shown. Protective oxide film 250 may protect a device from external impact or moisture. SiN or SiON can be used as the protective oxide film 250.

Figure 2C:
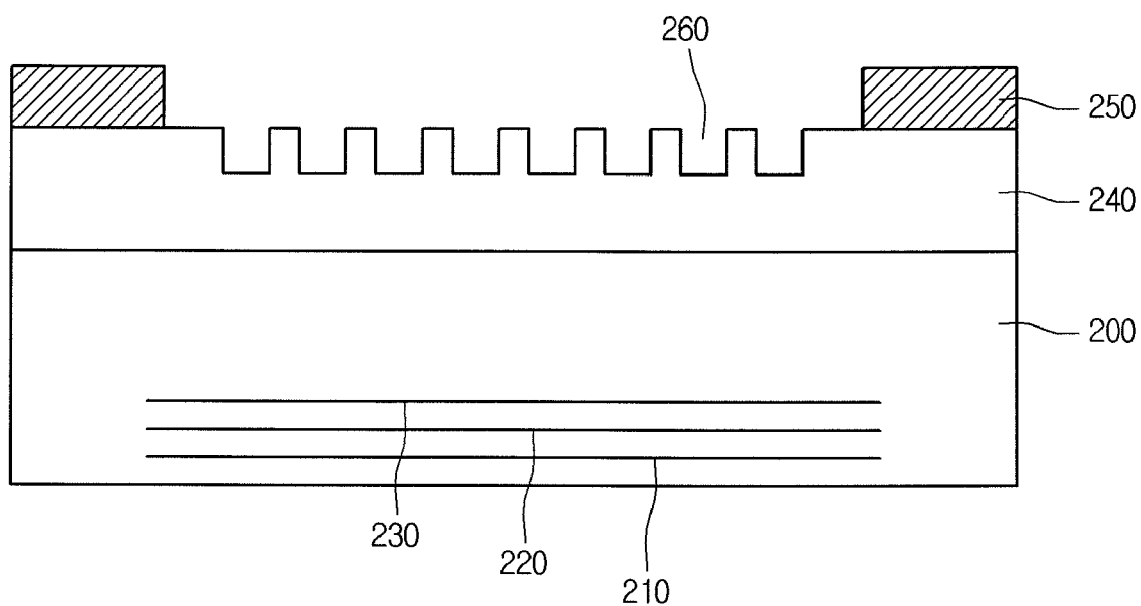

Referring to example FIG. 2c, a plurality of holes 260 having a predetermined depth and spaced from each other may be formed. Holes 260 may be formed by stacking, patterning and etching a photo mask over the wiring layer 240.

Figure 2D:
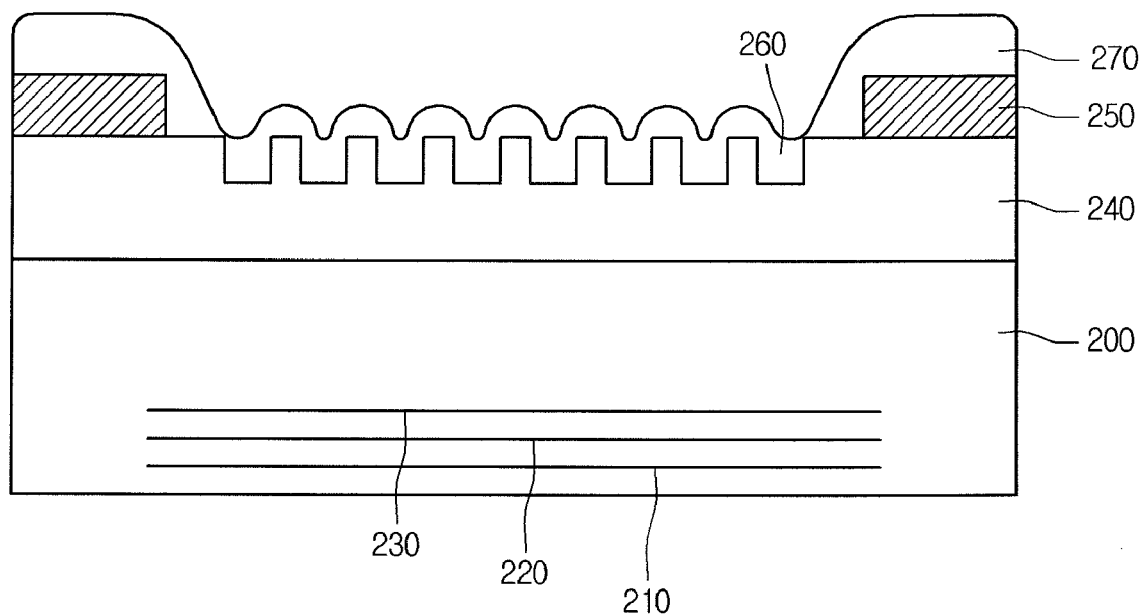

Referring to example FIG. 2d, the first oxide film 270 is stacked over the wiring layer 240 and the protective oxide film 250. Since the protective oxide film 250 as well as the hole 260 has a predetermined topology, the first oxide film 270 deposited over the protective oxide film 250 also has a predetermined height. The first oxide film 270 has a curved cross section, and is stacked over the protective oxide film 250. Undoped silica glass can be used as the first oxide film 270. In embodiments, the first oxide film 270 may be deposited by a high density plasma chemical vapor deposition (HDPCVD) method, giving a relatively uniform thin film.

Figure 2E:
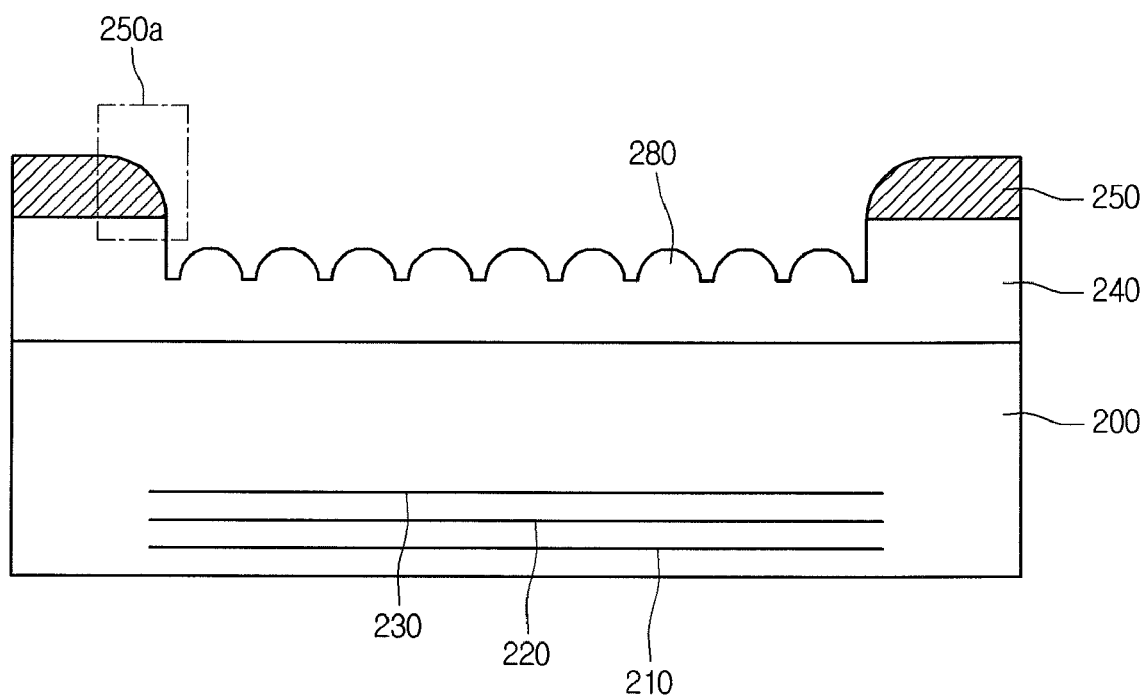

Referring to example FIG. 2e, the first oxide film 270 stacked over the hole 260 and the protective oxide film 250 may be removed by a dry etching process. Since the etching process removes the first oxide film 270 to a predetermined depth, the original surface profile may be substantially preserved. The protective oxide film 250 develops a smoothly inclined structure 250a, corresponding to the form of the first oxide film 270. Wiring layer 240 has a structure 280 with a predetermined topology which forms a micro lens for collecting light over photo diodes 210, 220, and 230. The protective oxide film with the inclined structure 250a allows subsequent etching and exposing processes to be uniformly performed over the substrate 200.

The CMOS image sensor according to the embodiments described above provides a micro lens having more constant radius of curvature, as compared to the image sensor according to the related art. Thus, the performance and sensitivity of the image sensor may be improved.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a photo diode over a semiconductor substrate;
   forming a wiring layer over the substrate;
   forming a protective oxide film over the wiring layer;
   forming a plurality of holes in the wiring layer using a first etching process;
   stacking a first oxide film over the wiring layer and the protective oxide film; and
   forming a plurality of micro lenses using a second etching process, wherein said protective oxide film has a smoothly inclined side structure.

2. The method according to claim 1, wherein said protective oxide film is formed only in areas which are not directly over said photo diode.

3. The method according to claim 1, wherein said first oxide film is removed by said second etching process.

4. The method according to claim 1, wherein said holes are spaced from each other and have a predetermined depth in the wiring layer over the area where the photo diode is formed.

5. The method according to claim 1, wherein said plurality of micro lenses have semi-circular cross sections.

6. The method according to claim 1, wherein said process of stacking said first oxide film comprises a high density plasma chemical deposition process.

7. The method according to claim 1, wherein said second etching process comprises a dry etching process.

8. The method according to claim 1, wherein the wiring layer comprises light-transmitting material.

9. The method according to claim 1, wherein said protective oxide film comprises one of SiN and SiON.

* * * * *